(12) United States Patent
Ecton et al.

(10) Patent No.: US 11,652,036 B2
(45) Date of Patent: May 16, 2023

(54) VIA-TRACE STRUCTURES

(71) Applicant: Intel Corporation, Santa Clara, CA (US)

(72) Inventors: Jeremy Ecton, Gilbert, TX (US); Hiroki Tanaka, Chandler, AZ (US); Kristof Kuwawi Darmawikarta, Chandler, AZ (US); Oscar Ojeda, Chandler, AZ (US); Arnab Roy, Chandler, AZ (US); Nicholas Haehn, Scottsdale, AZ (US)

(73) Assignee: Santa Clara

( * ) Notice: Subject to any disclaimer, the term of this patent is extended or adjusted under 35 U.S.C. 154(b) by 1025 days.

(21) Appl. No.: 15/942,864

(22) Filed: Apr. 2, 2018

(65) Prior Publication Data

US 2019/0304890 A1 Oct. 3, 2019

(51) Int. Cl.
| | |
|---|---|
| *H01L 23/498* | (2006.01) |
| *H01L 23/14* | (2006.01) |
| *H01L 23/00* | (2006.01) |
| *H01L 21/027* | (2006.01) |
| *G03F 7/039* | (2006.01) |
| *G03F 7/038* | (2006.01) |
| *G03F 7/20* | (2006.01) |
| *G03F 7/26* | (2006.01) |
| *H01L 21/48* | (2006.01) |

(52) U.S. Cl.
CPC ........ *H01L 23/49838* (2013.01); *G03F 7/038* (2013.01); *G03F 7/039* (2013.01); *G03F 7/20* (2013.01); *G03F 7/26* (2013.01); *H01L 21/0274* (2013.01); *H01L 21/4857* (2013.01); *H01L 23/145* (2013.01); *H01L 23/49822* (2013.01); *H01L 23/49866* (2013.01); *H01L 24/16* (2013.01); *H01L 2224/16227* (2013.01)

(58) Field of Classification Search
CPC ......... H01L 23/49838; H01L 23/49822; H01L 23/145; H01L 23/49866; H01L 24/16; H01L 2224/16227
See application file for complete search history.

(56) References Cited

U.S. PATENT DOCUMENTS

| | | | | |
|---|---|---|---|---|
| 4,070,501 | A * | 1/1978 | Corbin | H01L 21/312 438/675 |
| 4,118,523 | A * | 10/1978 | Bingham | H05K 3/427 438/667 |
| 5,229,647 | A * | 7/1993 | Gnadinger | H01L 24/72 257/785 |
| 5,422,516 | A * | 6/1995 | Hosokawa | H01L 24/13 257/784 |
| 6,831,367 | B2 * | 12/2004 | Sekine | H01L 25/0657 257/E21.597 |
| 8,637,968 | B2 * | 1/2014 | Haba | H01L 21/76898 257/276 |

(Continued)

*Primary Examiner* — Eugene Lee
(74) *Attorney, Agent, or Firm* — Akona IP PC (57) ABSTRACT

Disclosed herein are via-trace structures with improved alignment, and related package substrates, packages, and computing device. For example, in some embodiments, a package substrate may include a conductive trace, and a conductive via in contact with the conductive trace. The alignment offset between the conductive trace and the conductive via may be less than 10 microns, and conductive trace may have a bell-shaped cross-section or the conductive via may have a flared shape.

19 Claims, 6 Drawing Sheets

(56) References Cited

U.S. PATENT DOCUMENTS

| | | | |
|---|---|---|---|
| 8,791,575 B2* | 7/2014 | Oganesian | H01L 24/05 257/E23.174 |
| 8,796,828 B2* | 8/2014 | Oganesian | H01L 24/03 257/667 |
| 10,354,942 B2* | 7/2019 | Oganesian | H01L 23/481 |
| 2004/0016942 A1* | 1/2004 | Miyazawa | H01L 24/13 257/E21.597 |
| 2006/0046463 A1* | 3/2006 | Watkins | H01L 21/76898 257/E21.597 |
| 2006/0283625 A1* | 12/2006 | Yamamichi | H01L 25/0657 174/255 |
| 2007/0155174 A1* | 7/2007 | Taniguchi | H01L 23/49827 257/E23.009 |
| 2008/0308307 A1* | 12/2008 | Chang | H05K 3/108 174/257 |
| 2010/0307809 A1* | 12/2010 | Noda | H05K 3/4602 29/829 |
| 2011/0110061 A1* | 5/2011 | Leung | H05K 1/115 361/783 |
| 2011/0201197 A1* | 8/2011 | Nilsson | H01L 21/486 438/638 |
| 2012/0139082 A1* | 6/2012 | Oganesian | H01L 24/89 257/532 |
| 2016/0276307 A1* | 9/2016 | Lin | H01L 21/561 |
| 2016/0379871 A1* | 12/2016 | Tsai | H01L 21/76802 257/774 |
| 2017/0263557 A1* | 9/2017 | Clevenger | H01L 21/28562 |
| 2018/0132354 A1* | 5/2018 | Voraberger | H01L 23/498 |
| 2019/0181067 A1* | 6/2019 | Kim | H01L 24/11 |
| 2019/0393143 A1* | 12/2019 | Rosch | H01L 23/49827 |
| 2020/0258827 A1* | 8/2020 | Aleksov | H01L 23/49811 |

* cited by examiner

VIA-TRACE STRUCTURES

BACKGROUND

Integrated circuit (IC) packages may include one or more dies or other components mounted to a package substrate. The package substrate may include conductive pathways through which power, ground, and/or signals may be transmitted.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Disclosed herein are via-trace structures with improved alignment, and related package substrates, packages, and computing device. For example, in some embodiments, a package substrate may include a conductive trace, and a conductive via in contact with the conductive trace. The alignment offset between the conductive trace and the conductive via may be less than 10 microns, and conductive trace may have a bell-shaped cross-section or the conductive via may have a flared shape.

Conventional package substrate manufacturing techniques have been limited in their ability to decrease feature size while retaining necessary accuracy and without requiring costly materials. For example, lithographically patterned vias formed using existing package substrate lithography tools and readily commercially available materials (e.g., commercially available dry film resists) have been constrained to have a diameter greater than 10 microns. Further, lithographic techniques that involve multiple masks or drilling layouts to pattern different features are subject to limitations on how accurately these different masks or drilling layouts can be aligned or overlaid with each other, and thus feature sizes have been required to be large enough to accommodate these alignment errors.

The structures and techniques disclosed herein enable the formation of smaller and better-aligned features (e.g., vias and/or traces) in package substrates and other integrated circuit (IC) components. Some of these embodiments may utilize standard package substrate lithography tools and commercially available materials, while achieving these benefits. Further, various ones of the manufacturing processes disclosed herein may be less expensive and/or less complex than conventional techniques, while also achieving improved results.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

Figure 7A:
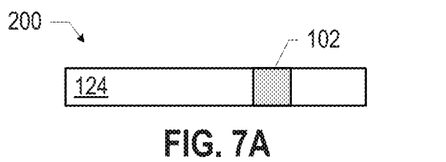
FIGS. 7A-7B, 8A-8B, 9A-9B, 10A-10B, 11A-11B, 12A-12B, and 13A-13B are various views of stages in an example process of manufacturing a via-trace structure, in accordance with various embodiments.
Figure 7B:
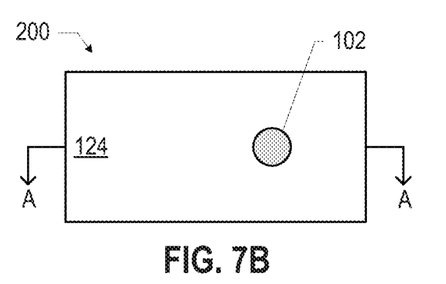

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y. For convenience, the phrase "FIG. 1" may be used to refer to the collection of drawings of FIGS. 1A-1B, the phrase "FIG. 7" may be used to refer to the collection of drawings of FIGS. 7A-7B, etc.

Figure 1A:
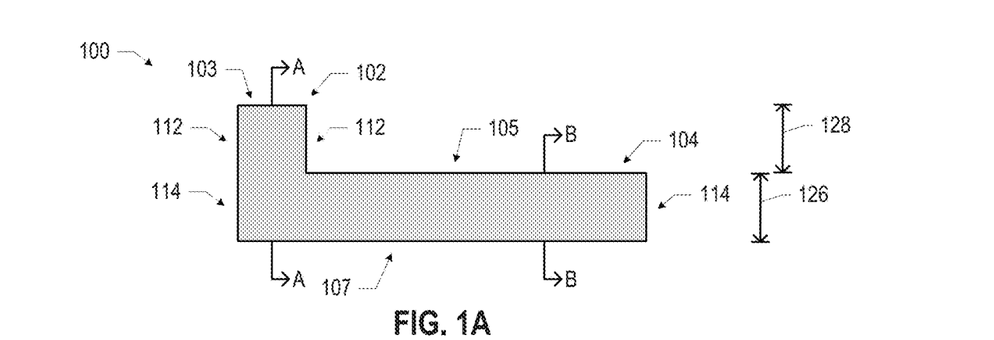
FIGS. 1A and 1B are various views of a via-trace structure, in accordance with various embodiments.
Figure 1B:
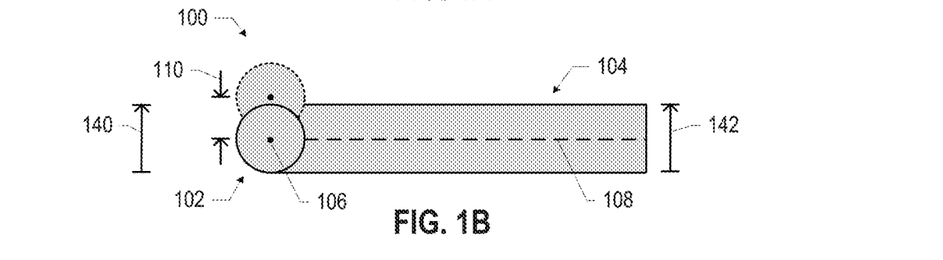

FIGS. 1A and 1B are various views of a via-trace structure 100, in accordance with various embodiments; FIG. 1A is a side, cross-sectional view of the via-trace structure 100, and FIG. 1B is a top view of the via-trace structure 100. The via-trace structure 100 includes a via 102 and a trace 104, and may be part of a larger network of vias 102 and traces 104 that provide conductive pathways 122 through a package substrate 120 (e.g., as discussed below with reference to FIGS. 6 and 19) or other IC component. In particular, a "vertical" via 102 may contact "horizontal" traces 104 in different layers of a package substrate 120 or other IC component to electrically couple these traces 104. Although FIG. 1 (and various other ones of the accompanying drawings) may depict the via 102 as located at one end of the trace 104, this is simply illustrative, and a via 102 may contact a trace 104 at any desired location along the trace 104.

As illustrated in FIG. 1B, the via 102 and the trace 104 may be aligned in that a centerpoint 106 of the via 102 (which may, as illustrated in FIG. 1B, have a circular footprint, or may have a non-circular footprint) may be aligned with the centerline 108 of the trace 104. Such a via-trace structure 100 may be referred to as a "zero misalignment" structure. In embodiments in which the via 102 has a non-circular footprint and/or the trace 104 does not have a substantially rectangular footprint, alignment of the via 102 and the trace 104 in a via-trace structure 100 may be determined by reference to any appropriate center reference of the via 102 and any appropriate center reference of the trace 104. A zero misalignment via-trace structure 100 may be contrasted with a conventional via-trace structure in which a via (shown in dotted lines in FIG. 1B) may be offset from a corresponding trace 104 by an alignment offset 110 greater than 5 microns (e.g., greater than 10 microns, or greater than 15 microns); embodiments of the via-trace structures 100 disclosed herein may have alignment offsets 110 less than 15 microns (e.g., less than 10 microns, less than 5 microns, or approximately equal to 0 microns). In zero misalignment via-trace structures 100, non-uniformities in the development and etch processes may affect the profiles of the vias 102 and/or the traces 104.

The via-trace structures 100 disclosed herein may include a conductive material (e.g., a metal, such as copper). In some embodiments, the via-trace structures 100 may include multiple different conductive materials. In some embodiments, the via-trace structures 100 may be surrounded by a dielectric material 124 (discussed below with reference to FIG. 6); the via-trace structures 100 may include or may be in contact with various liner materials (e.g., a diffusion liner to limit diffusion of the conductive material of the via-trace structures 100 into the surrounding dielectric material 124, and/or an adhesion liner to improve mechanical coupling between the via-trace structures 100 and the surrounding dielectric material 124).

The dimensions of the via-trace structures 100 may take any suitable values. For example, in some embodiments, a width (e.g., a maximum diameter) 140 of a via 102 may be greater than 5 microns (e.g., between 5 microns and 500 microns, between 5 microns and 50 microns, or between 5 microns and 10 microns). In some embodiments, a width (e.g., a maximum width) 142 of a trace 104 may be greater than 5 microns (e.g., between 5 microns and 500 microns, between 5 microns and 50 microns, or between 5 microns and 10 microns). In the embodiment of FIG. 1 (and various other ones of the accompanying drawings), the width 140 of the via 102 and the width 142 of the trace 104 may be the same; in other embodiments, the width 140 and the width 142 may be different (e.g., as discussed below with reference to FIG. 14). In some embodiments, a height 126 of the trace 104 may be between 5 microns and 35 microns. In some embodiments, a height 128 of the via 102 may be between 5 microns and 35 microns.

Figure 2:
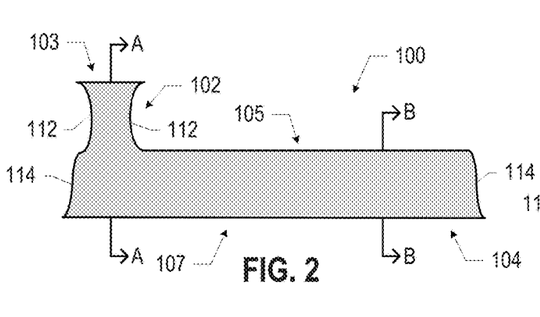
FIGS. 2-5 are side, cross-sectional views of example via-trace structures, in accordance with various embodiments.

Although FIG. 1 depicts a via-trace structure 100 with precisely rectilinear and/or perfectly circular contours, this representation is simply illustrative, and via-trace structures 100 fabricated using real manufacturing techniques may exhibit deviations from this representation. For example, FIG. 2 is a side, cross-sectional view of a via-trace structure 100 (sharing the perspective of FIG. 1), but in which the side faces 112 of the via 102, and the side faces 114 of the trace 104, are curved instead of flat. This curvature may arise due to the non-uniformity of the fabrication processes used to manufacture the via-trace structure 100 (e.g., in accordance with the process discussed below with reference to FIGS. 7-13).

Figures 3, 4:
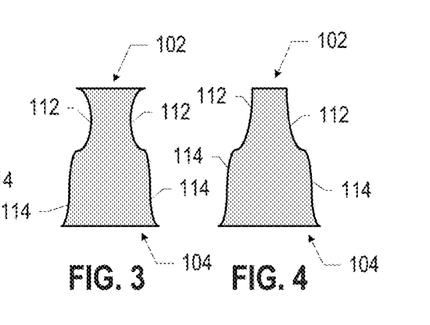

FIGS. 3-4 are side, cross-sectional views of an example via-trace structure 100 through the section A-A of FIG. 1 or 2. In the embodiment of FIG. 3, the side faces 112 of the via 102 may be flared in an hourglass shape (with wider portions near the top face 103 of the via 102 and near the trace 104), while the side faces 114 of the trace 104 may have a bell shape (with a narrower portion near the via 102, a wider portion near the bottom face 107 of the trace 104, and a change in curvature between). In the embodiment of FIG. 4, the side faces 112 of the via 102 may be flared in a volcano shape (with a narrower portion near the top face 103 of the via 102 and a wider portion near the trace 104), while the side faces 114 of the trace 104 may have a bell shape (with a narrower portion near the via 102, a wider portion near the bottom face 107 of the trace 104, and a change in curvature between).

Figure 5:
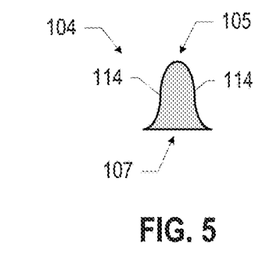

FIG. 5 is a side, cross-sectional view of an example via-trace structure 100 through the section B-B of FIG. 1 or 2. In the embodiment of FIG. 5, the side faces 114 of the trace 104 may have a bell shape (with a narrower portion near the top face 105 of the trace 104, a wider portion near the bottom face 107 of the trace 104, and a change in curvature between).

Figure 6:
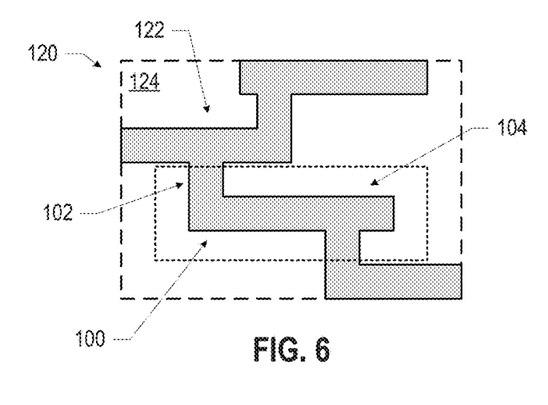
FIG. 6 is a side, cross-sectional view of an example portion of a package substrate including a via-trace structure, in accordance with various embodiments.

As noted above, in some embodiments, the via-trace structures 100 disclosed herein may be part of conductive pathways 122 through a package substrate 120. For example, FIG. 6 illustrates an example portion of a package substrate 120 including the via-trace structure 100 of FIG. 1, in accordance with various embodiments. The via-trace structure 100 of FIG. 1 may be part of a larger network of vias 102 and traces 104 that form conductive pathways 122 through the dielectric material 124 of the package substrate 120; other ones of the vias 102 and traces 104 included in a package substrate 120 may themselves form via-trace structures 100 (e.g., may be fabricated in accordance with the techniques discussed below with reference to FIGS. 7-13). The package substrate 120 may be part of an IC package 1650, as discussed below with reference to FIG. 19.

The via-trace structures 100 disclosed herein may be manufactured using any suitable techniques. For example, FIGS. 7-13 provide various views of stages in an example process of manufacturing a via-trace structure 100, in accordance with various embodiments. In particular, FIGS. 7-13 provide various views of stages of manufacturing the via-trace structure 100 in the package substrate 120 of FIG. 6. In FIGS. 7-13, the "A" sub-figures of FIGS. 7-13 represent side, cross-sectional views (analogous to the view of FIG. 1A, and through the section C-C of the "B" sub-figures) and the "B" sub-figures of FIGS. 7-13 represent top views (analogous to the view of FIG. 1B). The process illustrated in FIGS. 7-13 may be a subtractive process in that an initially deposited conductive material 132 has portions removed to form the via-trace structure 100. Such a subtractive process may enable the formation of via-trace structures 100 with smaller features than may be achieved using conventional semi-additive processes (in which a conductive material must fill in cavities in another material, and cavities below a threshold size may not be successfully filled). Further, the process illustrated in FIGS. 7-13 may involve the lithographic patterning of the via-trace structure 100 using a single mask to achieve zero misalignment. As such, the process illustrated in FIGS. 7-13 may be referred to as a subtractive etch patterned zero misalignment lithography via (SEPZMV) process.

FIG. 7 illustrates an assembly 200 including a dielectric material 124 and a via 102. The dielectric material 124 and the via 102 may represent the top of a portion of a package substrate 120 formed in accordance with the techniques disclosed herein; for example, the via 102 may itself be part of a via-trace structure 100. The assembly 200 represents an example assembly on which a via-trace structure 100 may be formed, but a via-trace structure 100 may be formed on any suitable starting material or support (e.g., in accordance with the techniques discussed below with reference to FIGS. 8-13).

Figure 8A:
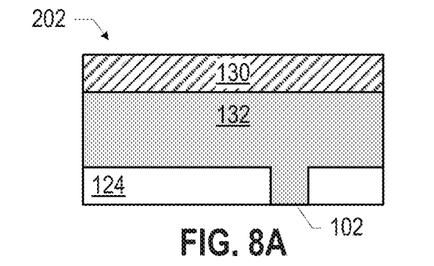
Figure 8B:
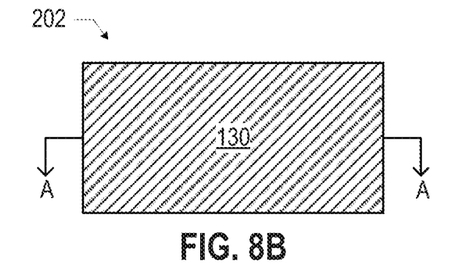

FIG. 8 illustrates an assembly 202 subsequent to depositing a conductive material 132 and a layer of photoresist 130 on the assembly 200 (FIG. 7). The conductive material 132 may be deposited to a desired thickness using any suitable technique. In some embodiments, the conductive material 132 may be deposited by a plating operation (e.g., electroplating or electroless plating). This plating operation may be a "blanket" plating operation performed on a substantially flat top surface of the assembly 200, as shown, and may be less expensive and/or complex than plating a conductive material 132 on a "patterned," or contoured, surface (e.g., as required in some semi-additive fabrication methods). The photoresist 130 may include any suitable photoresist, such as a spin-on or laminated photoresist. In some embodiments, the photoresist 13 may be a dry film resist.

Figure 9A:
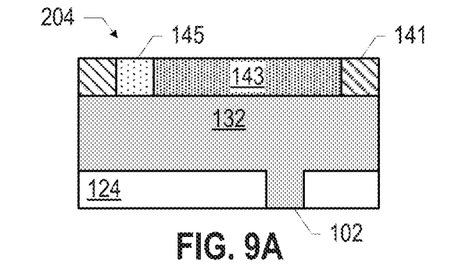
Figure 9B:
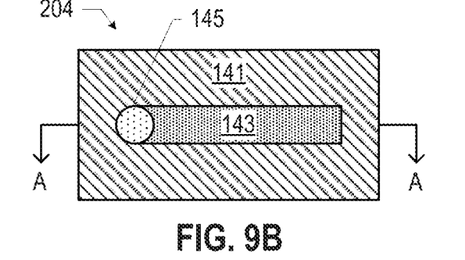

FIG. 9 illustrates an assembly 204 subsequent to performing a lithographic operation in which the photoresist 130 of the assembly 202 (FIG. 8) is exposed with a single grayscale mask to simultaneously expose different areas of the photoresist 130 to different amounts ("doses") of electromagnetic energy. In particular, a first exposure dose area 141 may be exposed to a first dose of electromagnetic energy, a second exposure dose area 143 may be exposed to a second dose of electromagnetic energy different from the first dose, and a third exposure dose area 145 may be exposed to a third dose of electromagnetic energy different from the first and second doses. The magnitude of the second dose may be between the magnitude of the first dose and the magnitude of the third dose, so that the first exposure dose area 141 is most readily removed during development, the second exposure dose area 143 is next most readily removed during development, and the third exposure dose area 145 is least readily removed during development. In some embodiments, the photoresist 130 may be a negative-type resist in which unexposed (or less exposed) areas of the photoresist 130 may be more readily removed during subsequent development; in some such embodiments, the first dose of electromagnetic energy may be an approximately zero dose (e.g., the grayscale mask may be "black" in the area corresponding to the first exposure dose area 141). In some embodiments, the photoresist 130 may be a positive-type resist in which more heavily exposed areas of the photoresist 130 may be more readily removed during subsequent development; in some such embodiments, the third dose of electromagnetic energy may be an approximately zero dose (e.g., the grayscale mask may be "black" in the area corresponding to the third exposure dose area 145). Using a single grayscale mask to pattern the photoresist 130 into the exposure dose areas 141/143/145 may ensure that these exposure dose areas are aligned with each other in a desired manner; such alignment may not be achievable using conventional techniques in which vias and traces are separately patterned (e.g., using multiple masks, one or more masks and/or one or more via drilling layouts, etc.) and thus are limited in their ability to achieve "perfect" alignment with each other (and therefore exhibit significant alignment offsets 110).

Figure 10A:
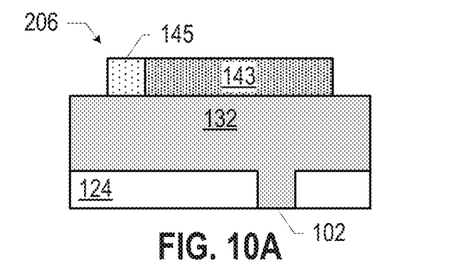
Figure 10B:
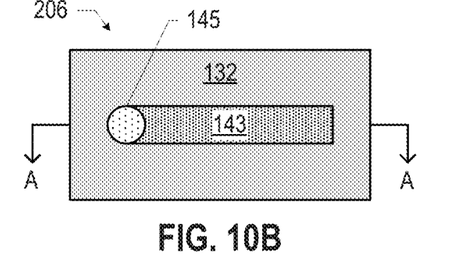

FIG. 10 illustrates an assembly 206 subsequent to developing the exposed photoresist of the assembly 204 (FIG. 9) so as to remove the first exposure dose area 141. In some embodiments, this development operation may be a "fast" develop so that only the first exposure dose area 141 (the most readily removed) is removed, and the second exposure dose area 143 and the third exposure dose area 145 remain in the assembly 206. The removal of the first exposure dose area 141 may uncover portions of a surface of the conductive material 132.

Figure 11A:
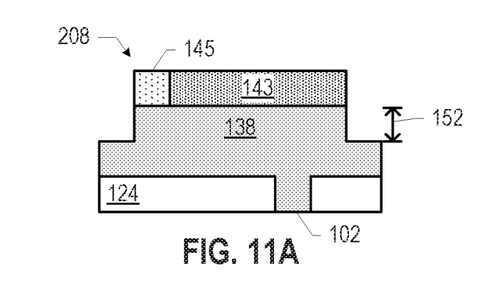
Figure 11B:
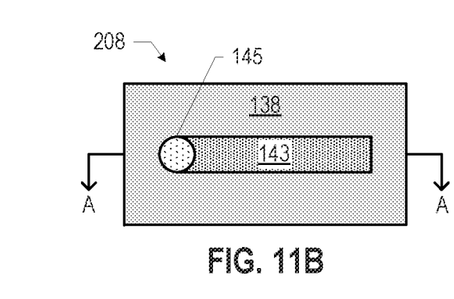

FIG. 11 illustrates an assembly 208 subsequent to etching the conductive material 132 of the assembly 206 (FIG. 10) not covered by the first exposure dose area 143 or the second exposure dose area 145. In some embodiments, this etching may be a timed etch whose timing is selected to achieve a desired etch depth 152. This etch depth 152 may be substantially equal to the height 128 of the via 102 in the via-trace structure 100, as discussed below.

Figure 12A:
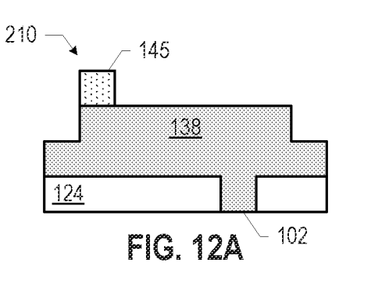
Figure 12B:
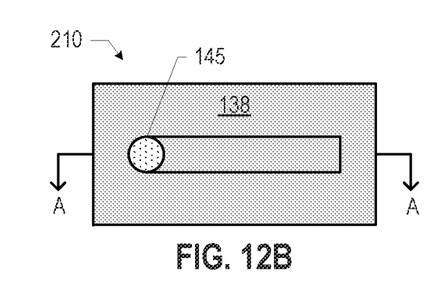

FIG. 12 illustrates an assembly 210 subsequent to developing the exposed photoresist of the assembly 208 (FIG. 11) so as to remove the second exposure dose area 143. In some embodiments, this development operation may be "slower" than the develop operation discussed above with reference to FIG. 10 so that only the second exposure dose area 143 (more readily removed than the third exposure dose area 145) is removed; the third exposure dose area 145 may remain in the assembly 210, as shown. The removal of the second exposure dose area 143 may uncover further portions of the surface of the conductive material 132; these further portions of the conductive material 132 may serve a resist-like purpose in the subsequent etch, as discussed below.

Figure 13A:
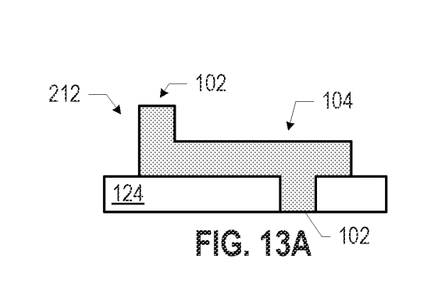
Figure 13B:
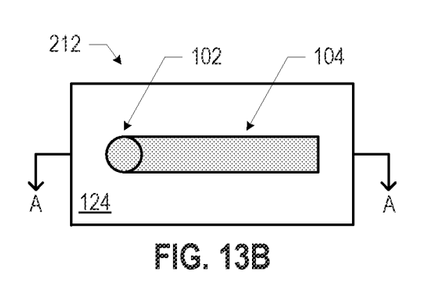

FIG. 13 illustrates an assembly 212 subsequent to etching the conductive material 132 of the assembly 210 (FIG. 12) not covered by the third exposure dose area 145 to yield the via-trace structure 100, and then removing the third exposure dose area 145 by performing a resist strip. The portion of the conductive material 132 exposed by removal of the second exposure dose area 143 may serve as a dynamic "resist" for the patterning of the underlying conductive material 132, one that is removed over time during the etch process. The etching operations of FIGS. 11 and 13 may result in non-rectangular geometries for the via-trace structure 100, as discussed above with reference to FIGS. 2-5.

Figure 14:
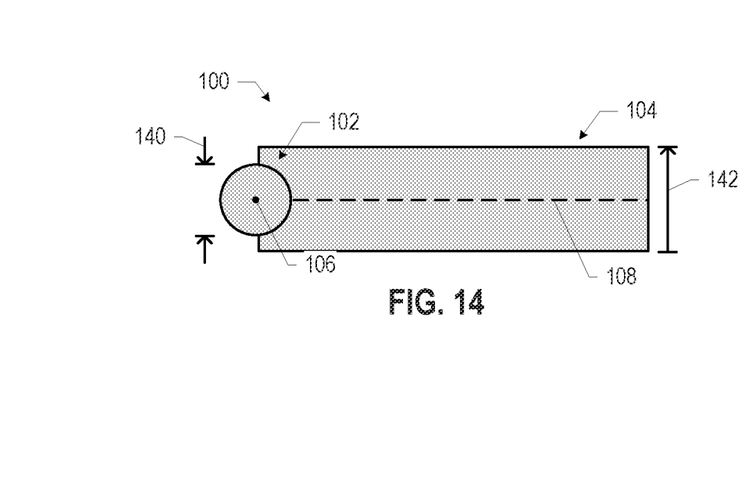
FIGS. 14 and 15 are top views of example via-trace structures, in accordance with various embodiments.

As noted above, in some embodiments, the width 140 of the via 102 and the width 142 of the trace 104 in a via-trace structure 100 may not be equal. For example, FIG. 14 is a top view (analogous to the view of FIG. 1B) of a via-trace structure 100 in which the width 142 is greater than the width 140.

Figure 15:
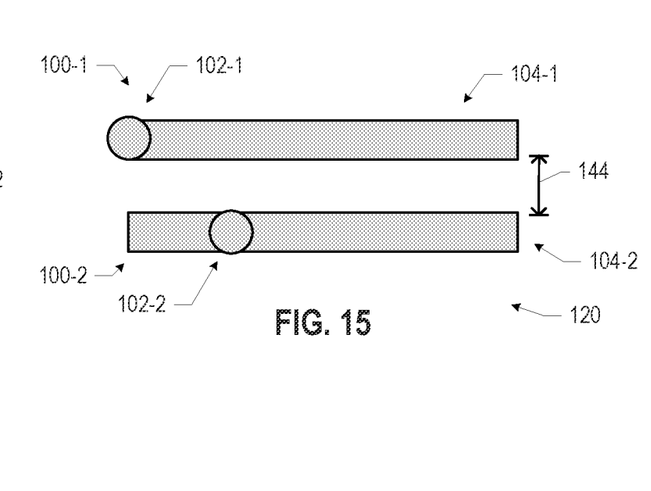

A single layer of a package substrate 120 (or other IC component) may include multiple via-trace structures 100. For example, FIG. 15 is a top view (analogous to the view of FIG. 1B) of a single layer in a package substrate 120 including multiple via-trace structures 100-1 and 100-2, in accordance with various embodiments. The traces 104-1 and 104-2 in FIG. 15 may be adjacent and parallel, and may be separated by an inter-trace spacing 144. In conventional package substrates, the ratio between the height 128 of a via 102 and the inter-trace spacing 144 may be constrained to be greater than 1:2 (due to, e.g., limitations imposed by conventional manufacturing techniques). The via-trace structures 100 disclosed herein may have a ratio of the inter-trace spacing 144 to the height 128 of a via 102 that is greater than 0.5:1 (e.g., between 0.5:1 and 1.2:1, between 1:1 and 2:1, or between 1.2:1 and 2:1), improving design flexibility and/or decreasing feature size.

Figure 16:
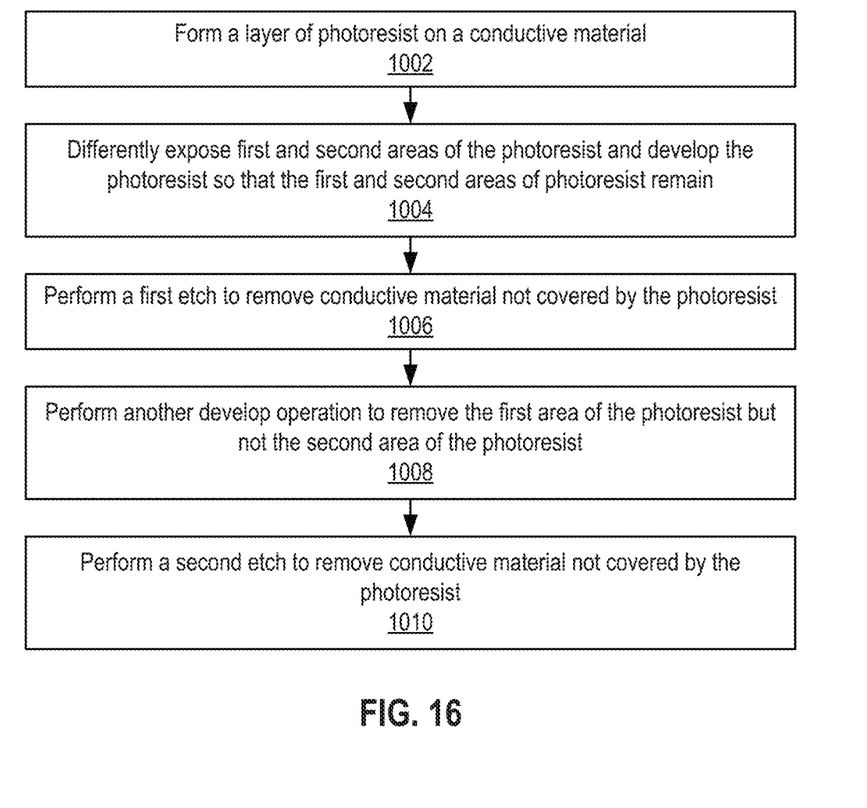
FIG. 16 is a flow diagram of a method of manufacturing a via-trace structure, in accordance with various embodiments.

FIG. 16 is a flow diagram of a method 1000 of manufacturing a via-trace structure, in accordance with various embodiments. For example, the method 1000 may be performed as part of the fabrication of a package substrate 120. Although the operations of the method 1000 may be illustrated with reference to particular embodiments of the via-trace structures 100 disclosed herein, the method 1000 may be used to form any suitable via-trace structure. Operations are illustrated once each and in a particular order in FIG. 16, but the operations may be reordered and/or repeated as desired (e.g., with different operations performed in parallel when manufacturing multiple electronic components simultaneously).

At 1002, a layer of photoresist may be formed on a conductive material. For example, a photoresist 130 may be deposited on a conductive material 132, as discussed above with reference to FIGS. 7-8.

At 1004, first and second areas of the photoresist may be differently exposed with a single mask, and then developed to leave the first and second areas of the photoresist on the conductive material. For example, the photoresist 130 may be exposed by a single grayscale mask to form a first exposure dose area 141, a second exposure dose area 143, and a third exposure dose area 145, and then the first exposure dose area 141 may be removed by a "fast" develop operation, as discussed above with reference to FIGS. 9-10. In some embodiments, the first exposure dose area 141 may be unexposed, or the third exposure dose area 145 may be unexposed; in other embodiments, the first exposure dose area 141, the second exposure dose area 143, or the third exposure dose area 145 may all be exposed with some non-zero amount of electromagnetic energy.

At 1006, a first etch may be performed to remove conductive material not covered by the photoresist. For example, the conductive material 132 may be etched so as to remove conductive material 132 not protected by the second exposure dose area 143 or the third exposure dose area 145, as discussed above with reference to FIG. 11.

At 1008, another develop operation may be performed to remove the first area of the photoresist but not the second area of the photoresist. For example, the second exposure dose area 143 may be removed by a develop operation, leaving the third exposure dose area 145, as discussed above with reference to FIG. 12.

At 1010, a second etch may be performed to remove conductive material not covered by the photoresist to form a via-trace structure. For example, the conductive material 132 may be etched so as to remove conductive material 132 not protected by the third exposure dose area 145 to form a via-trace structure 100, as discussed above with reference to FIG. 13.

The via-trace structures 100 disclosed herein may be included in any suitable electronic component. FIGS. 17-21 illustrate various examples of apparatuses that may include any of the via-trace structures 100 disclosed herein.

Figure 17:
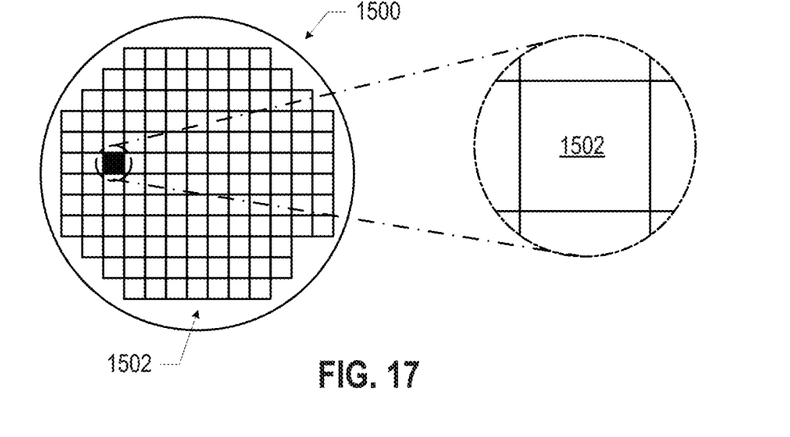
FIG. 17 is a top view of a wafer and dies that may be included in a package along with via-trace structures, in accordance with any of the embodiments disclosed herein.

FIG. 17 is a top view of a wafer 1500 and dies 1502 that may be included in an IC package whose substrate includes one or more via-trace structures 100 (e.g., as discussed below with reference to FIG. 19) in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 18, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 21) or other logic that is configured to store information in the memory devices or execute instructions stored in the memory array.

Figure 18:
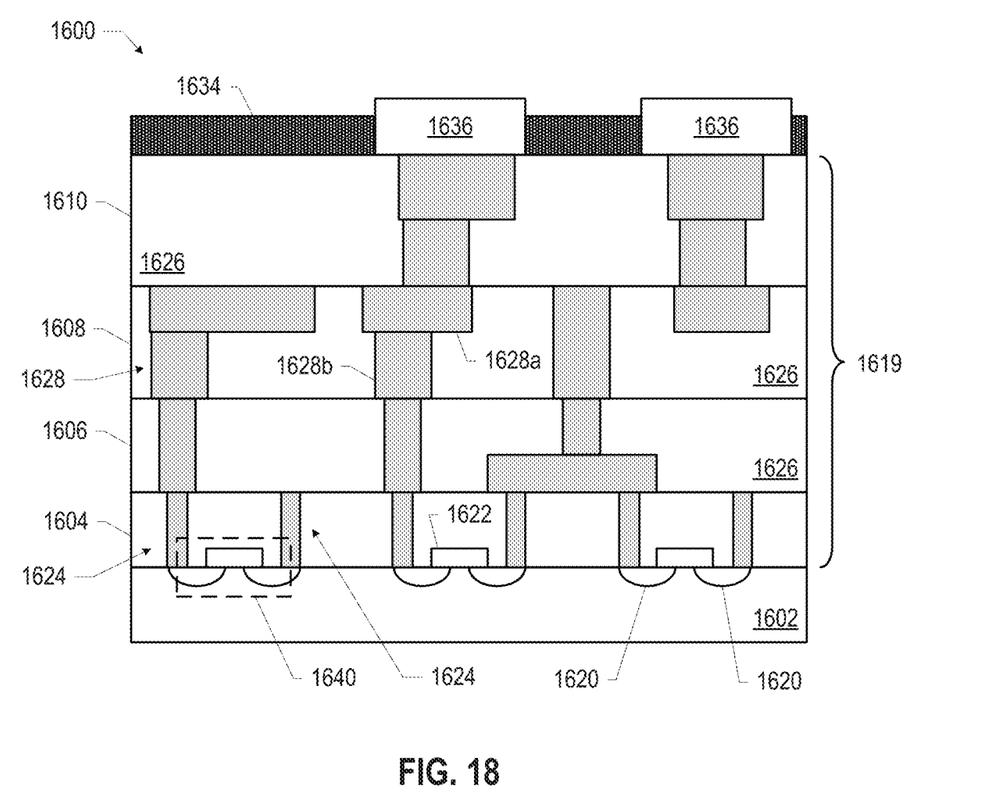
FIG. 18 is a side, cross-sectional view of an integrated circuit (IC) device that may be included in a package along with via-trace structures, in accordance with any of the embodiments disclosed herein.

FIG. 18 is a side, cross-sectional view of an IC device 1600 that may be included in an IC package whose substrate includes one or more via-trace structures 100 (e.g., as discussed below with reference to FIG. 19), in accordance with any of the embodiments disclosed herein. One or more of the IC devices 1600 may be included in one or more dies 1502 (FIG. 17). The IC device 1600 may be formed on a substrate 1602 (e.g., the wafer 1500 of FIG. 17) and may be included in a die (e.g., the die 1502 of FIG. 17). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 17) or a wafer (e.g., the wafer 1500 of FIG. 17).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 18 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 18 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 18). Although a particular number of interconnect layers 1606-1610 is depicted in FIG. 18, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 18. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 18. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 18, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 19:
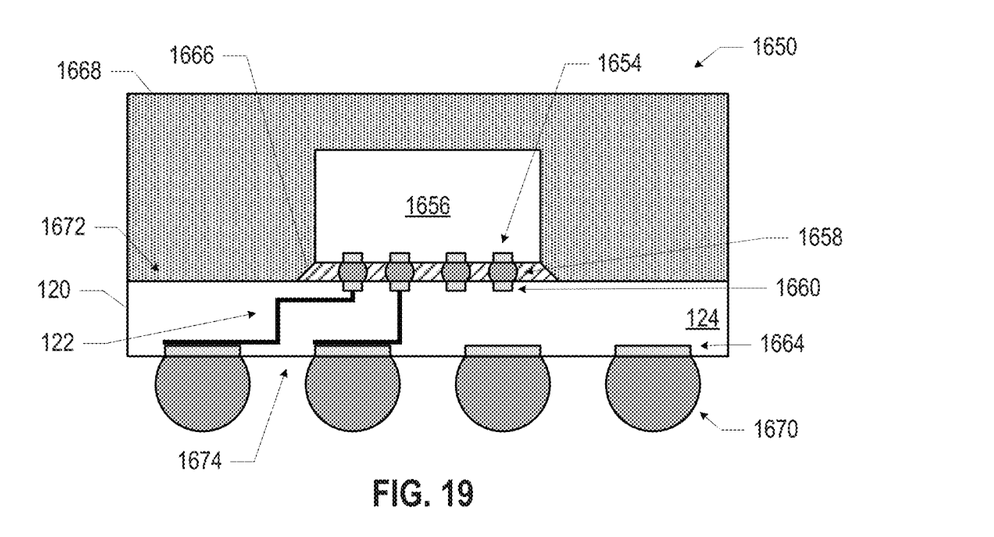
FIG. 19 is a side, cross-sectional view of an IC package that may include via-trace structures, in accordance with various embodiments.

FIG. 19 is a cross-sectional view of an example IC package 1650 that may include one or more via-trace structures 100 in the package substrate 120. As discussed above with reference to FIG. 6, the package substrate 120 may include a dielectric material 124, and may have conductive pathways 122 extending through the dielectric material 124 between the face 1672 and the face 1674, or between different locations on the face 1672, and/or between different locations on the face 1674. These conductive pathways 122 may include any of the via-trace structures 100 disclosed herein.

The IC package 1650 may include a die 1656 coupled to the package substrate 120 via conductive contacts 1654 of the die 1656, first-level interconnects 1658, and conductive contacts 1660 of the package substrate 120. The conductive contacts 1660 may be coupled to conductive pathways 122 through the package substrate 120, allowing circuitry within the die 1656 to electrically couple to various ones of the conductive contacts 1664 (or to other devices included in the package substrate 120, not shown). The first-level interconnects 1658 illustrated in FIG. 19 are solder bumps, but any suitable first-level interconnects 1658 may be used. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

In some embodiments, an underfill material 1666 may be disposed between the die 1656 and the package substrate 120 around the first-level interconnects 1658, and a mold compound 1668 may be disposed around the die 1656 and in contact with the package substrate 120. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 19 are solder balls (e.g., for a ball grid array arrangement), but any suitable second-level interconnects 16770 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 20.

Although the IC package 1650 illustrated in FIG. 19 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although a single die 1656 is illustrated in the IC package 1650 of FIG. 19, an IC package 1650 may include multiple dies 1656 (e.g., with one or more of the multiple dies 1656 electrically coupled to via-trace structures 100 included in the package substrate 120). An IC package 1650 may include additional passive components, such as surface-mount resistors, capacitors, and inductors disposed on the first face 1672 or the second face 1674 of the package substrate 120. More generally, an IC package 1650 may include any other active or passive components known in the art.

Figure 20:
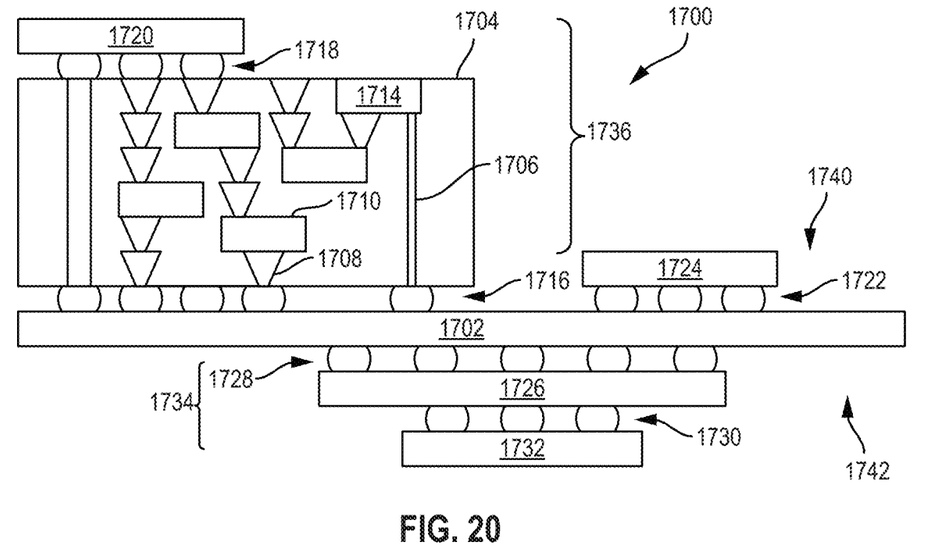
FIG. 20 is a side, cross-sectional view of an IC device assembly that may include via-trace structures, in accordance with any of the embodiments disclosed herein.

FIG. 20 is a side, cross-sectional view of an IC device assembly 1700 that may include one or more IC packages or other electronic components including one or more via-trace structures 100, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the IC package 1650 discussed above with reference to FIG. 19 (e.g., may include one or more via-trace structures 100 in a package substrate 120).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 20 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 20), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 20, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 17), an IC device (e.g., the IC device 1600 of FIG. 18), or any other suitable component. Generally, the interposer 1704 may spread a connection to a wider pitch or reroute a connection to a different connection. For example, the interposer 1704 may couple the IC package 1720 (e.g., a die) to a set of BGA conductive contacts of the coupling components 1716 for coupling to the circuit board 1702. In the embodiment illustrated in FIG. 20, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

In some embodiments, the interposer 1704 may be formed as a printed circuit board (PCB), including multiple metal layers separated from one another by layers of dielectric material and interconnected by electrically conductive vias. In some embodiments, the interposer 1704 may be formed of an epoxy resin, a fiberglass-reinforced epoxy resin, an epoxy resin with inorganic fillers, a ceramic material, or a polymer material such as polyimide. In some embodiments, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to through-silicon vias (TSVs) 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art. In some embodiments, the interposer 1704 may include one or more via-trace structures 100.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 20 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 21:
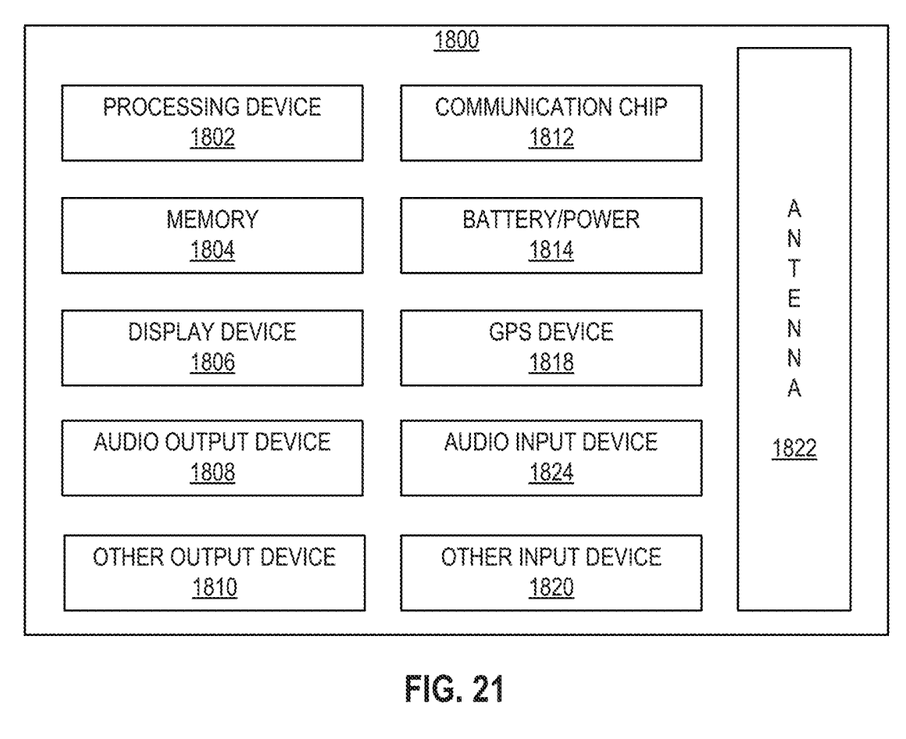
FIG. 21 is a block diagram of an example electrical device that may include via-trace structures, in accordance with any of the embodiments disclosed herein.

FIG. 21 is a block diagram of an example electrical device 1800 that may include one or more via-trace structures 100, in accordance with any of the embodiments disclosed herein. For example, any suitable ones of the components of the electrical device 1800 may include one or more of the IC packages 1650, IC devices 1600, or dies 1502 disclosed herein. A number of components are illustrated in FIG. 21 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 21, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is an integrated circuit (IC) package substrate, including: a conductive trace; and a conductive via in contact with the conductive trace, wherein the conductive via has a flared shape; wherein an alignment offset between the conductive trace and the conductive via is less than 10 microns.

Example 2 may include the subject matter of Example 1, and may further specify that the conductive via has a maximum diameter between 5 microns and 10 microns.

Example 3 may include the subject matter of any of Examples 1-2, and may further specify that the conductive via has a maximum diameter greater than 5 microns.

Example 4 may include the subject matter of any of Examples 1-3, and may further specify that the conductive trace has a maximum width between 5 microns and 50 microns.

Example 5 may include the subject matter of any of Examples 1-4, and may further specify that the conductive trace has a maximum width greater than 5 microns.

Example 6 may include the subject matter of any of Examples 1-5, and may further specify that the conductive trace is a first conductive trace, the IC package substrate includes a second conductive trace in a same layer as the first conductive trace, and a ratio of an inter-trace spacing between the first conductive trace and the second conductive trace to a height of the conductive via is between 0.5:1 and 2:1.

Example 7 may include the subject matter of any of Examples 1-6, and may further specify that the conductive trace is a first conductive trace, the IC package substrate includes a second conductive trace in a same layer as the first conductive trace, and a ratio of an inter-trace spacing between the first conductive trace and the second conductive trace to a height of the conductive via is between 1.2:1 and 2:1.

Example 8 may include the subject matter of any of Examples 1-7, and may further specify that an alignment offset between the conductive trace and the conductive via is less than 1 micron.

Example 9 may include the subject matter of any of Examples 1-8, and may further include: a dielectric material in contact with the conductive trace, wherein the dielectric material includes an organic material.

Example 10 may include the subject matter of any of Examples 1-9, and may further specify that the conductive trace and the conductive via include copper.

Example 11 may include the subject matter of any of Examples 1-10, and may further specify that the conductive trace has a bell-shaped cross-section.

Example 12 is an integrated circuit (IC) package substrate, including: a conductive trace, wherein the conductive trace has a bell-shaped cross-section; and a conductive via in contact with the conductive trace; wherein an alignment offset between the conductive trace and the conductive via is less than 10 microns.

Example 13 may include the subject matter of Example 12, and may further specify that the conductive via has a maximum diameter between 5 microns and 10 microns.

Example 14 may include the subject matter of any of Examples 12-13, and may further specify that the conductive via has a maximum diameter greater than 5 microns.

Example 15 may include the subject matter of any of Examples 12-14, and may further specify that the conductive trace has a maximum width between 5 microns and 50 microns.

Example 16 may include the subject matter of any of Examples 12-15, and may further specify that the conductive trace has a maximum width greater than 5 microns.

Example 17 may include the subject matter of any of Examples 12-16, and may further specify that the conductive trace is a first conductive trace, the IC package substrate includes a second conductive trace in a same layer as the first conductive trace, and a ratio of an inter-trace spacing between the first conductive trace and the second conductive trace to a height of the conductive via is between 0.5:1 and 2:1.

Example 18 may include the subject matter of any of Examples 12-17, and may further specify that the conductive trace is a first conductive trace, the IC package substrate includes a second conductive trace in a same layer as the first conductive trace, and a ratio of an inter-trace spacing between the first conductive trace and the second conductive trace to a height of the conductive via is between 1.2:1 and 2:1.

Example 19 may include the subject matter of any of Examples 12-18, and may further specify that an alignment offset between the conductive trace and the conductive via is less than 1 micron.

Example 20 may include the subject matter of any of Examples 12-19, and may further include: a dielectric material in contact with the conductive trace, wherein the dielectric material includes an organic material.

Example 21 may include the subject matter of any of Examples 12-20, and may further specify that the conductive trace and the conductive via include copper.

Example 22 is a computing device, including: an integrated circuit (IC) package, including a package substrate and a die coupled to the package substrate; wherein the package substrate includes a conductive trace, and a conductive via in contact with the conductive trace, wherein the conductive trace has a bell-shaped cross-section or the conductive via has a flared shape, and wherein an alignment offset between the conductive trace and the conductive via is less than 10 microns.

Example 23 may include the subject matter of Example 22, and may further specify that the conductive trace has a bell-shaped cross-section and the conductive via has a flared shape.

Example 24 may include the subject matter of any of Examples 22-23, and may further specify that the conductive via has a maximum diameter between 5 microns and 10 microns.

Example 25 may include the subject matter of any of Examples 22-24, and may further specify that the conductive via has a maximum diameter greater than 5 microns.

Example 26 may include the subject matter of any of Examples 22-25, and may further specify that the conductive trace has a maximum width between 5 microns and 50 microns.

Example 27 may include the subject matter of any of Examples 22-26, and may further specify that the conductive trace has a maximum width greater than 5 microns.

Example 28 may include the subject matter of any of Examples 22-27, and may further specify that the conductive trace is a first conductive trace, the IC package substrate includes a second conductive trace in a same layer as the first conductive trace, and a ratio of an inter-trace spacing between the first conductive trace and the second conductive trace to a height of the conductive via is between 1.2:1 and 2:1.

Example 29 may include the subject matter of any of Examples 22-28, and may further specify that an alignment offset between the conductive trace and the conductive via is less than 1 micron.

Example 30 may include the subject matter of any of Examples 22-29, and may further include: a dielectric material in contact with the conductive trace, wherein the dielectric material includes an organic material.

Example 31 may include the subject matter of any of Examples 22-30, and may further specify that the conductive trace and the conductive via include copper.

Example 32 may include the subject matter of any of Examples 22-31, and may further include: a circuit board; wherein the IC package is coupled to the circuit board.

Example 33 may include the subject matter of any of Examples 22-32, and may further include: a display.

Example 34 may include the subject matter of any of Examples 22-33, and may further include: an input device.

Example 35 may include the subject matter of any of Examples 22-34, and may further specify that the computing device is a handheld computing device.

Example 36 is a method of manufacturing an integrated circuit (IC) package substrate, including: forming a layer of conductive material; forming a layer of photoresist; differently exposing different areas of the photoresist with electromagnetic energy, wherein a first area of the photoresist receives a different amount of electromagnetic energy than a second area of the photoresist; after differently exposing, performing a first develop operation to remove some of the photoresist, wherein the first and second areas remain after the first develop operation; after performing the first develop operation, performing a first etch of exposed conductive material; after performing the first etch, performing a second develop operation to remove the first area of photoresist but not the second area of photoresist; and after performing the second develop operation, performing a second etch of the exposed conductive material.

Example 37 may include the subject matter of Example 36, and may further specify that the photoresist is a dry film resist.

Example 38 may include the subject matter of any of Examples 36-37, and may further specify that differently exposing different areas of the photoresist includes using a single grayscale mask to expose the photoresist.

Example 39 may include the subject matter of any of Examples 36-38, and may further specify that the first etch is a timed etch.

Example 40 may include the subject matter of any of Examples 36-39, and may further specify that the first etch undercuts the photoresist.

Example 41 may include the subject matter of any of Examples 36-40, and may further specify that forming the layer of conductive material includes performing a blanket plating operation.

Example 42 may include the subject matter of any of Examples 36-41, and may further specify that the second area of the photoresist receives no electromagnetic energy during the differential exposure of different areas of the photoresist.

The invention claimed is:

1. An integrated circuit (IC) package substrate, comprising:
a conductive trace in a dielectric material, the conductive trace having curved sides between a narrow first portion and a broad second portion; and
a conductive via in the dielectric material, the conductive via in contact with the narrow first portion of the conductive trace at a bottom face of the conductive via, wherein the conductive via has a flared shape with a first portion at a top face, a second portion at a center and a third portion at the bottom face of the conductive via, the first portion and the third portion being wider than the second portion;
wherein:
a first axis is in a direction from the bottom face of the conductive via to the top face of the conductive via,
a second axis is perpendicular to the first axis,
a third axis is perpendicular to the first axis and the second axis,
the conductive trace extends further than the conductive via at least along the second axis, and
an alignment offset along the second axis or the third axis is less than 10 microns, the alignment offset comprising a center-to-center distance between the conductive trace and the conductive via.

2. The IC package substrate of claim 1, wherein the conductive via has a maximum diameter between 5 microns and 10 microns.

3. The IC package substrate of claim 1, wherein the conductive trace is a first conductive trace, the IC package substrate includes a second conductive trace in a same layer as the first conductive trace, and a ratio of an inter-trace spacing between the first conductive trace and the second conductive trace to a height of the conductive via is between 0.5:1 and 2:1.

4. The IC package substrate of claim 1, wherein the alignment offset between the conductive trace and the conductive via is less than 1 micron.

5. The IC package substrate of claim 1,
wherein the dielectric material includes an organic material.

6. The IC package substrate of claim 1, wherein the conductive trace and the conductive via include copper.

7. The IC package substrate of claim 1, wherein the conductive trace has a bell-shaped cross-section between the narrow first portion and the broad second portion.

8. An integrated circuit (IC) package substrate, comprising:
a conductive trace in a dielectric material, wherein the conductive trace has a bell-shaped cross-section with a first portion at a top face and a second portion at a bottom face of the conductive trace, the first portion being narrower than the second portion; and
a conductive via in the dielectric material, the conductive via in contact with the conductive trace at the top face of the conductive trace, the conductive via having a wider portion proximate to the top face of the conductive trace and a narrower portion away from the top face of the conductive trace;
wherein:
a first axis is in a direction from the bottom face of the conductive trace to a top of the conductive via,
a second axis is perpendicular to the first axis,
a third axis is perpendicular to the first axis and the second axis, the conductive trace extends further than the conductive via at least along the second axis, and an alignment offset along the second axis or the third axis is less than 10 microns, the alignment offset comprising a center-to-center distance between the conductive trace and the conductive via.

9. The IC package substrate of claim 8, wherein the conductive trace has a maximum width greater than 5 microns.

10. The IC package substrate of claim 8, wherein the alignment offset between the conductive trace and the conductive via is less than 1 micron.

11. A computing device, comprising:
an integrated circuit (IC) package, including a package substrate and a die coupled to the package substrate; wherein:
the package substrate includes:
a conductive trace in a dielectric material; and
a conductive via in the dielectric material, the conductive via in contact with the conductive trace at a top face of the conductive trace,
the conductive trace has a bell-shaped cross-section with a first portion at the top face of the conductive trace and a second portion at a bottom face of the conductive trace, the first portion being narrower than the second portion,
a first axis is in a direction from the top face of the conductive trace to a top of the conductive via,
a second axis is perpendicular to the first axis,
a third axis is perpendicular to the first axis and the second axis,
the conductive trace extends further than the conductive via at least along the second axis, and
an alignment offset along the second axis or the third axis is less than 10 microns, the alignment offset comprising a center-to-center distance between the conductive trace and the conductive via.

12. The computing device of claim 11, wherein the conductive trace has a bell-shaped cross-section and the conductive via has a flared shape with a third portion at a top face of the conductive via, a fourth portion at a center of the conductive via and a fifth portion at a bottom face of the conductive via, the third portion and the fifth portion being wider than the fourth portion.

13. The computing device of claim 11, wherein the alignment offset between the conductive trace and the conductive via is less than 1 micron.

14. The computing device of claim 11,
wherein the dielectric material includes an organic material.

15. The computing device of claim 11, wherein the conductive trace and the conductive via include copper.

16. The computing device of claim 11, further comprising:
a circuit board;
wherein the IC package is coupled to the circuit board.

17. The computing device of claim 11, further comprising:
a display.

18. The computing device of claim 11, further comprising:
an input device.

19. The computing device of claim 11, wherein the computing device is a handheld computing device.

* * * * *

UNITED STATES PATENT AND TRADEMARK OFFICE
CERTIFICATE OF CORRECTION

| | | |
|---|---|---|
| PATENT NO. | : 11,652,036 B2 | Page 1 of 1 |
| APPLICATION NO. | : 15/942864 | |
| DATED | : May 16, 2023 | |
| INVENTOR(S) | : Jeremy Ecton et al. | |

It is certified that error appears in the above-identified patent and that said Letters Patent is hereby corrected as shown below:

On the Title Page

In Item (73), under "Assignee", in Column 1, Line 1, delete "SANTA CLARA" and insert -- INTEL CORPORATION, SANTA CLARA, CA (US) --, therefor.

Signed and Sealed this
Twentieth Day of June, 2023

Katherine Kelly Vidal
*Director of the United States Patent and Trademark Office*